United States Patent [19]
De Lange

[11] Patent Number: 6,091,261
[45] Date of Patent: Jul. 18, 2000

[54] APPARATUS AND METHOD FOR PROGRAMMABLE DELAYS USING A BOUNDARY-SCAN CHAIN

[75] Inventor: Willem De Lange, Los Altos, Calif.

[73] Assignee: Sun Microsystems, Inc., Palo Alto, Calif.

[21] Appl. No.: 09/191,418

[22] Filed: Nov. 12, 1998

[51] Int. Cl.[7] .......................... G06F 7/38; H03K 19/173; G01R 31/28

[52] U.S. Cl. ................... 326/38; 326/39; 326/16; 326/93; 714/727

[58] Field of Search ................. 326/39, 40, 41, 326/16, 93, 37; 714/725, 726, 727

[56] References Cited

U.S. PATENT DOCUMENTS

| | | | |
|---|---|---|---|
| 5,740,410 | 4/1998 | McDermott | 395/556 |
| 5,926,053 | 7/1999 | McDermott et al. | 327/298 |
| 5,948,114 | 9/1999 | Klingler | 714/733 |
| 6,020,757 | 2/2000 | Jenkins, IV | 326/39 |

*Primary Examiner*—Michael Tokar
*Assistant Examiner*—Daniel D. Chang
*Attorney, Agent, or Firm*—William S. Galliani; Pennie & Edmonds LLP

[57] ABSTRACT

The invention is a system that provides programmable clock delays for logic circuits. The system makes use of the boundary-scan register chain incorporated into logic devices for testing purposes. In the invention, delay code values are loaded through the boundary-scan register chain into delay code registers. The delay codes are then used to program the value of delay elements in the logic circuit. An evaluation logic circuit can be included to compare the output data with an expected test pattern and thereby verify the acceptability of the delay values. The invention thereby allows delays to be adjusted to correct functionality and/or optimize circuit performance without requiring modifications to the circuit design.

9 Claims, 7 Drawing Sheets

APPARATUS AND METHOD FOR PROGRAMMABLE DELAYS USING A BOUNDARY-SCAN CHAIN

FIELD OF THE INVENTION

The present invention relates generally to digital logic circuits, and particularly to a programmable delay system for dynamic logic circuits.

BACKGROUND OF THE INVENTION

Dynamic logic uses a sequence of precharge and conditional evaluation phases to realize complex logic functions with less transistors than static logic and shorter delays. During the precharge phase of the clock cycle the output node of a dynamic gate is precharged through a pull-up transistor to $V_{DD}$. After precharge, in the evaluation phase, depending upon the values of the inputs a path between the output node and ground may be created. If such a path is created the output node is discharged. If not, the precharged value of the output node is maintained for that cycle.

Figure 1:
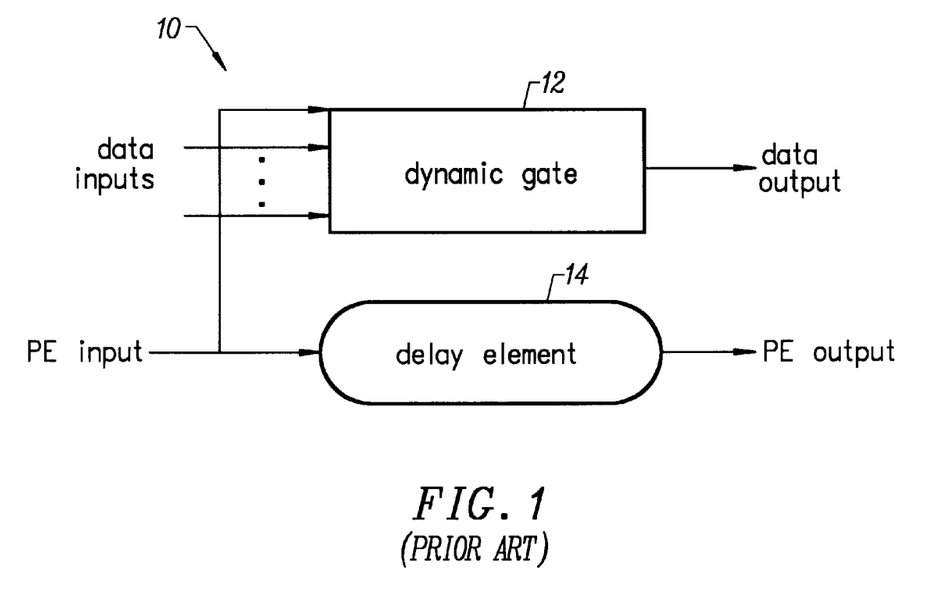
FIG. 1 illustrates a clock-delayed domino logic gate.

Domino logic is a dynamic logic family widely used in high speed compact circuits. Domino logic is used in the Pentium Pro™ processor, sold by Intel Corp., Santa Clara, Calif.; the Alpha™ processor, sold by Compaq Corp., Houston, Tex.; and a variety of other state of the art processors. Clock-delayed ("CD") domino logic is a self-timed dynamic logic family. CD domino logic has a dynamic gate 12 and, if necessary, a clock delay element 14, as shown in FIG. 1. In the most basic clocking scheme, only the clock from the slowest gate at each gate level needs to have a clock delay element. In a more general clocking scheme the clock tree can be designed with each gate using the clock from its slowest input, rather than the same clock for the entire gate level. Using the clock from the slowest input to the gate guarantees that all inputs are stable when a CD domino gate goes into the evaluate phase. The use of a delay element allows CD domino gates to provide a self-timed delay of the precharge/evaluate signal. The precharge evaluate (PE) output of the delay element tells the next gate when the data output is ready. The dynamic gate can be either non-inverting (domino type), as in FIG. 1, or inverting, without an inverter at the output.

The purpose of the delay element 14 is to track the data output. When the PE signal input is low, the dynamic gate will precharge. After the PE signal input switches from low to high, a data input signal has been set up to be evaluated and the dynamic gate drives a final output value onto its output node. CD domino logic is described in more detail in "Clock-Delayed (CD) Domino for Adder and Combinational Logic Design," 1063-6404/96, pp. 332–337, IEEE 1996.

Implementing CD domino logic circuits requires very precise determination of delays, and thorough characterization of the most critical path. A large block containing CD domino logic circuits, such as in a microprocessor, may use six different phase clock signals. Each phase clock signal may be used to control a stage containing a number of operations. For example, a stage may contain 32 operations, and each operation may include two to five gates. All 32 of these operations are performed within the time between the rising edges of two subsequent phase clock signals.

At each stage, it is critical for proper circuit operation that the input signals are valid and stable at each rising clock edge. The clock phase signals can be delayed with respect to the most critical path using fixed delays to attempt to ensure that the input signals are valid and stable at the rising clock edge. However, circuit manufacturing process variations, changes in process parameters, and voltage and temperature variations can all cause changes in the timing of multiple clock phase CD domino logic circuits. To account for all of these variations in the design, explicit margins are considered in the implementation of the clock delay circuits. Improper estimation of these variations may then require hardware modifications to restore valid timing relationships. Thus an improved system of implementing delays in CD domino logic that overcomes these and other problems of the prior art would be highly desirable.

The testing of integrated circuits commonly involves an operation of shifting test instructions and associated test data into an integrated circuit and subsequently analyzing the output generated by the integrated circuit. The Joint Test Access Group (JTAG) developed an integrated circuit and circuit board testing standard called the IEEE Standard Test Access Port and Boundary-Scan Architecture IEEE Std 1149.1-1990 and IEEE Std 1149.1a-1993 (referred to herein as the IEEE 1149.1 standard), which is incorporated herein by reference.

The IEEE 1149.1 standard defines test logic that can be included in integrated circuits to provide standardized approaches to testing an integrated circuit, testing the interconnections between integrated circuits once they have been assembled onto a printed circuit board, and observing circuit activity during the circuit's normal operation.

As is well known, a boundary-scan implementation allows for testing of interconnects in a board environment by loading or "scanning in" test patterns into a series of interconnected boundary-scan registers. Each test pattern loaded in the boundary-scan registers provides a different set of control and data signals to the output drivers. The response of the output drivers to the test patterns can be scanned out and captured by an adjacent circuit on the board. To run a functional test vector, an input test pattern is scanned in through the boundary-scan registers. After one or more clock cycles, the response of the circuit can then be captured in the boundary-scan registers and either scanned out or monitored at the output pads.

SUMMARY OF THE INVENTION

The invention is a system that provides programmable clock delays for logic circuits. The system makes use of the boundary-scan register chain incorporated into logic devices for testing purposes. In the invention, delay code values are loaded through the boundary-scan register chain into delay code registers. The delay codes are then used to program the value of delay elements in the logic circuit. The invention thereby allows delays to be adjusted to optimize circuit performance without requiring modifications to the circuit design.

In one embodiment, the invention is used in clock-delayed (CD) domino logic circuits that use a plurality of clock signals having different phases. The timing relationships between the different clock signals are critical and must be carefully controlled. The different clock signals are generated by using the programmable delay elements to delay a signal cycle. The invention provides the flexibility of defining delay values after a device has been fabricated which enables shorter delay values to be used without impacting yields. The invention can be used to define clock delays for an entire block. Alternatively, the invention can also be implemented to control delay elements of individual gates in critical timing paths.

Evaluation logic can also be included to compare output data from the CD domino logic circuit with an expected output data pattern. A group of comparators can be used to compare the actual and expected data, and a single output signal indicating the result of the tests can be provided. Alternatively, the output data and comparison results can be transmitted through the boundary-scan register chain to an external test system. For enhanced evaluation capability, a software programmable PLA can be used to perform the evaluation operations.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the drawings.

DESCRIPTION OF THE PREFERRED EMBODIMENTS

Figure 2:
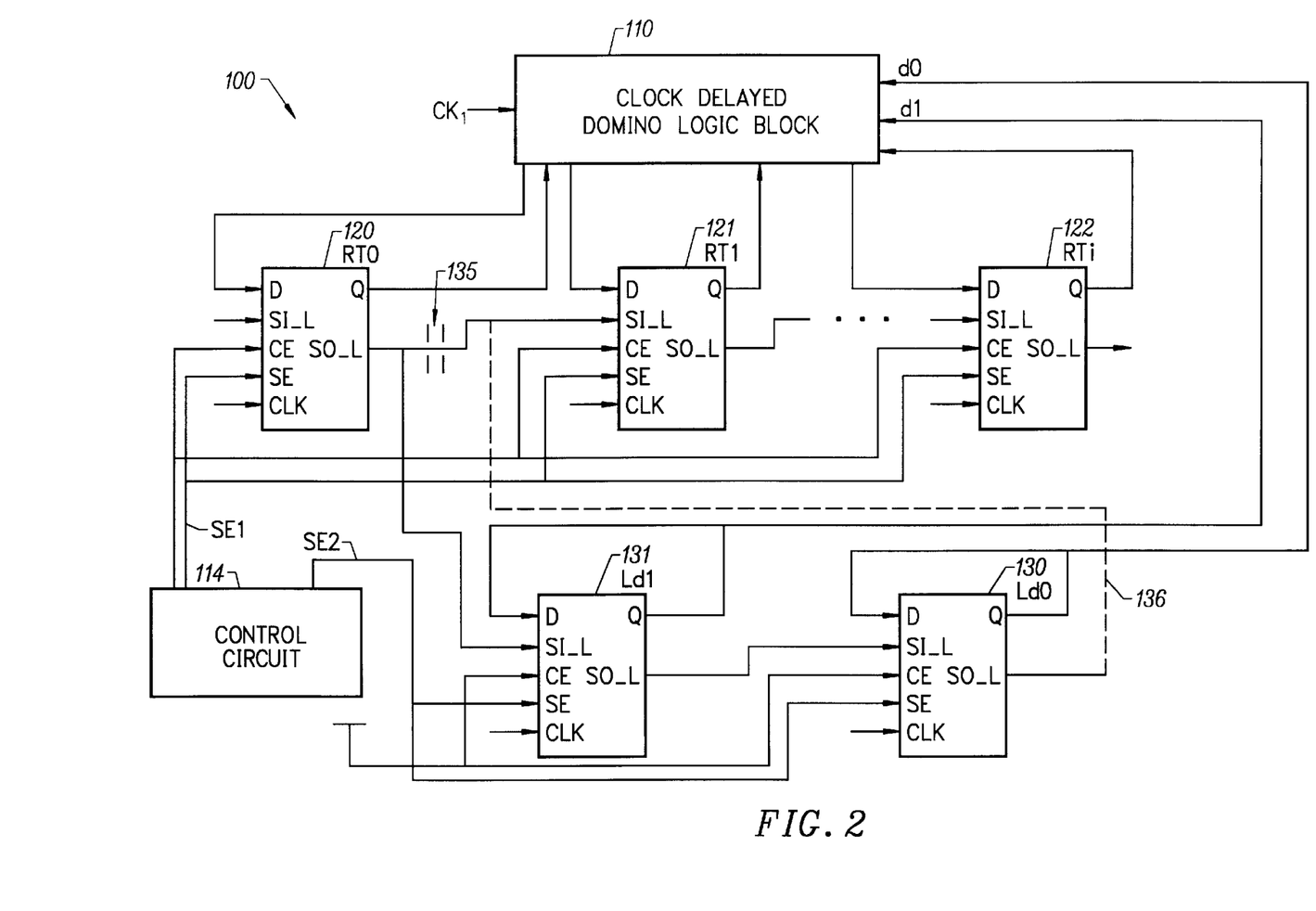
FIG. 2 illustrates a block diagram of a clock-delayed (CD) domino logic system with a programmable delay element according to an embodiment of the present invention.

The present invention provides a programmable delay system for CD domino logic that uses the boundary-scan architecture incorporated into circuits for test purposes. Referring to FIG. 2, there is shown a block diagram of a clock-delayed (CD) domino logic system with a programmable delay element according to the present invention. The CD domino logic system 100 includes a CD domino logic block 110. In one embodiment, CD domino logic block 110 comprises an execution unit of a microprocessor. Only the signal inputs to CD domino logic block 110 relating to the present invention have been shown, in a typical system implementation CD domino logic block 110 would have numerous other data, control, and clock signal inputs and outputs. Boundary-scan registers Rt0 120, Rt1 121 through Rti 122 form a boundary-scan chain. Delay code registers Ld0 130 and Ld1 131 are coupled to the boundary-scan chain. Delay code registers Ld0 130 and Ld1 131 each store one bit of a two bit delay code that determines the duration of one or more programmable delay elements in CD domino logic block 110. The delay code registers illustrate an example of one type of memory element that can be used to store the delay codes. A typical microprocessor implementation may include hundreds of delay code registers.

The CD domino logic system 100 has three modes of operation: program mode, scan mode, and a normal operating mode. In program mode, delay codes are clocked through the boundary-scan registers Rt0 120–Rti 122 to the delay code registers Ld0 130 and Ld1 131 to define the delays of the programmable delay elements. To place the system into program mode control circuit 114 asserts the SE1 and SE2 scan enable control signals. The SE1 signal is coupled to each of the boundary-scan registers Rt0 120–Rti 122. The SE2 signal is coupled to the delay code registers Ld0 130 and Ld1 131. Input data is provided from an external source and coupled to the scan input (SI_L) terminal of register Rt0 120. The data is then clocked through Rt0 120 to the scan output (SO_L) terminal and is thereby coupled to Rt1 121. In this manner the data is propagated through the boundary-scan register chain to the SI_L inputs of the delay code registers Ld0 130 and Ld1 131. When the data has reached the intended delay code registers program mode is terminated by control circuit 114 de-asserting the SE1 and SE2 control signals.

The delay code received at the SI_L input of the delay code registers is coupled to the Q output and is thereby provided to a programmable delay element. The Q output of each of the delay code registers is fedback to the D input so that the delay code register maintains the delay code value.

In an alternative embodiment, delay code registers Ld0 130 and Ld1 131 can be coupled in series in the boundary-scan register chain. This configuration is indicated by dashed line 136 coupling the SO_L output of delay code register Ld0 130 to the SI_L input of boundary-scan register Rt1 121, and dashed lines 135 indicating a decoupling of the Rt0 120 SO_L output from the Rt1 121 SI_L input, as shown in FIG. 2. With the delay code registers in the boundary-scan register chain, the delay code registers can also be used at the evaluation stage to read out the delay code of these registers. A multiplexer at the D input of Ld0 and Ld1 controlled by SE2 to store output values from CD domino logic block 110 can also be used.

In scan mode test pattern data is clocked through the boundary-scan chain. Scan mode includes loading initialization test data patterns into CD domino logic block 110 through the boundary-scan chain, and outputting data results from CD domino logic block 110 through the boundary-scan chain to external evaluation logic.

To place the system into scan mode control circuit 114 asserts the SE1 scan enable control signal coupled to each of the boundary-scan registers Rt0 120–Rti 122. The SE2 scan enable control signal is set to a logic low level, thus the values stored by the delay code registers are not changed in scan mode. As in program mode, input data is provided from an external source and coupled to the scan input (SI_L) terminal of register Rt0 120. The data is then clocked through Rt0 120 to the scan output (SO_L) terminal and is thereby coupled to Rt1 121. After an initialization test data pattern has been loaded into the boundary-scan registers, the initialization data are coupled through the Q outputs of the boundary-scan registers to CD domino logic block 110.

After the delay elements have been programmed and an initialization test data pattern has been loaded into CD domino logic block 110, CD domino logic block 110 performs logic operations and outputs results to the D inputs of boundary-scan registers 120–122. Control circuit 114 asserts the CE signal to clock the output data from CD domino logic block 110 into the D inputs of boundary-scan registers Rt0–Rti. Control circuit 114 then can assert the SE1 signal to shift this data through the boundary-scan chain to an external evaluation logic circuit to verify the functionality of the circuit.

Figure 3:
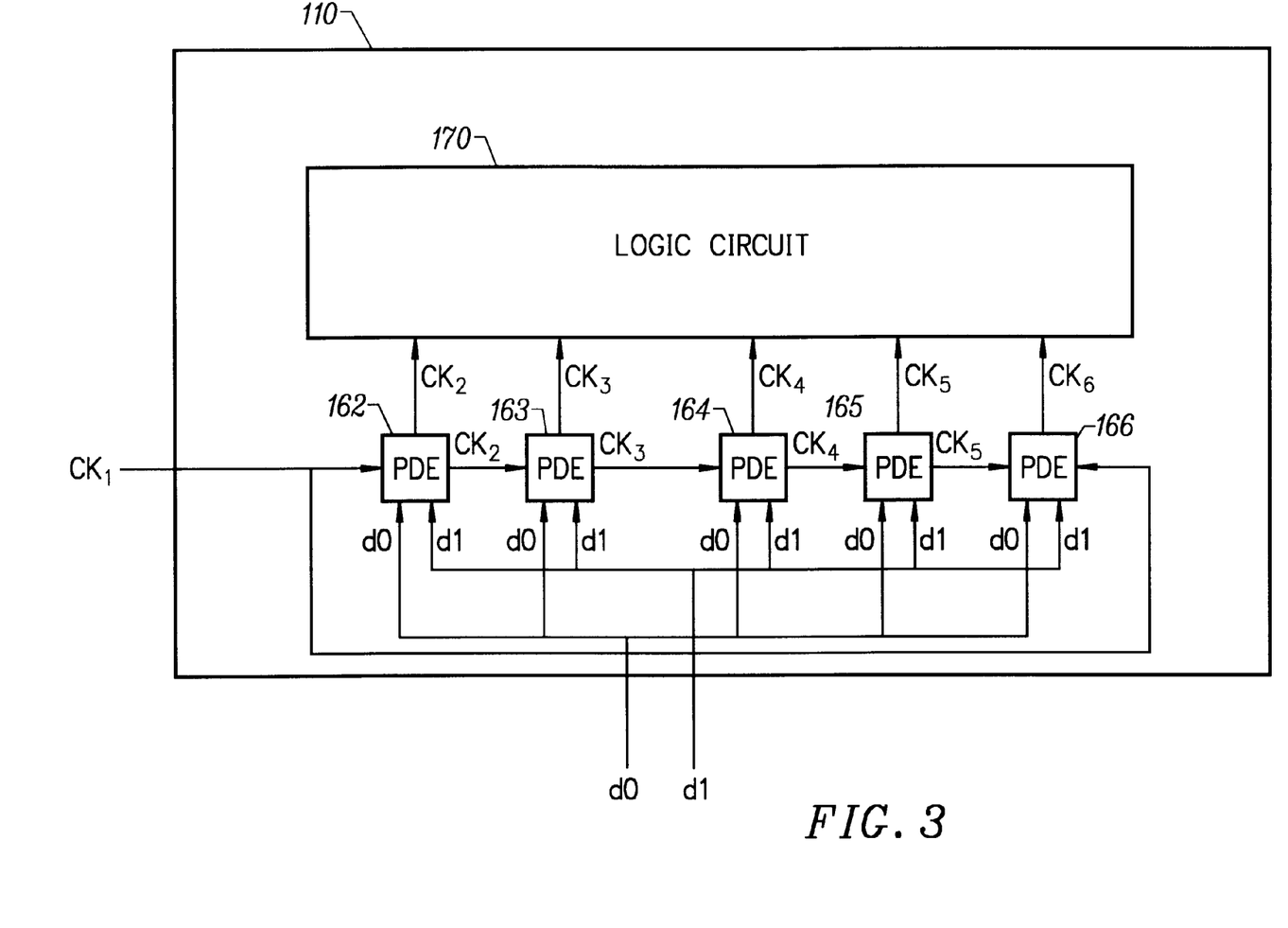
FIG. 3 illustrates a block diagram of clock-delayed domino logic block according to an embodiment of the present invention.
Figure 4:
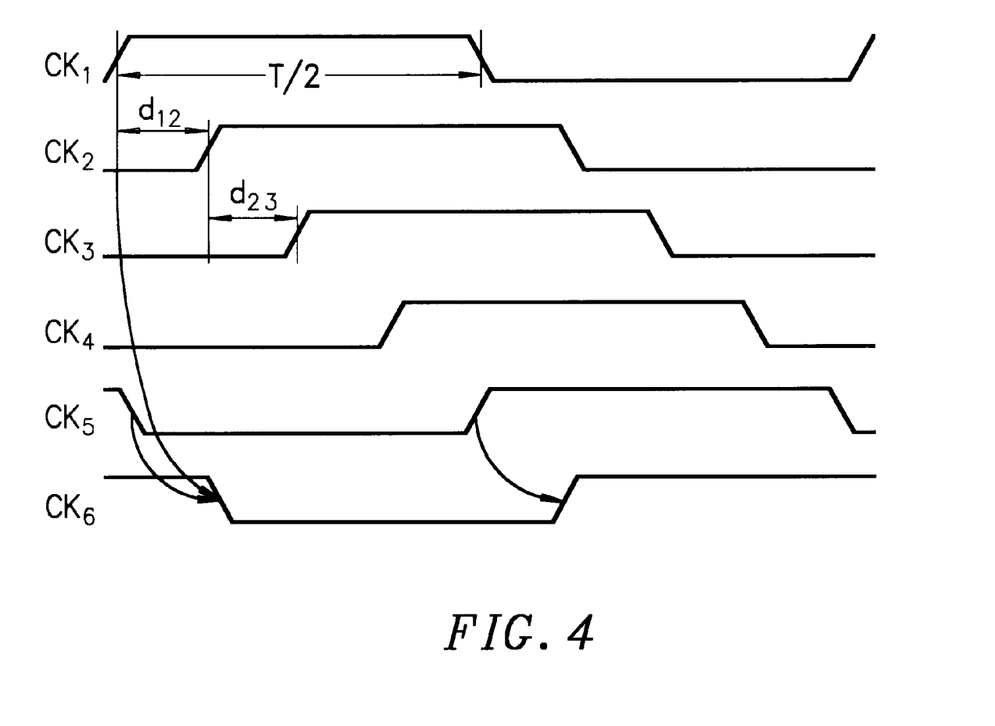
FIG. 4 illustrates a timing diagram of the six clock signals in the CD domino logic circuit according to an embodiment of the present invention.

FIG. 3 illustrates a block diagram of CD domino logic block 110. Logic block 110 includes a logic circuit 170 and five programmable delay elements (PDE) 162–166. The programmable delay elements generate clock signals $CK_2$–$CK_6$ each having a different phase as illustrated in FIG. 4. In the FIG. 3 embodiment a single delay code d0, d1 is used for all five of the programmable clock delay elements. In this embodiment, the duration of the delay for each delay element may be designed to be different, however, the same two bit delay code is provided to all of the delay elements. This approach minimizes the amount of additional circuitry that must be added to provide the programmable delay elements. For illustration purposes only five programmable delay elements are shown in FIG. 3, however, in a typical microprocessor hundreds of programmable delay elements may be used. Also FIG. 3 illustrates using programmable delays for the most basic clocking scheme, where only the clock from the slowest gate at each gate level has a clock delay element. In the more general clocking scheme where the clock tree is designed with each gate using the clock from its slowest input, rather than the same clock for the entire gate level, programmable delay elements can be implemented for particular gates and thereby interspersed throughout logic circuit 170.

FIG. 4 illustrates a timing diagram of the six clock signals in the CD domino logic circuit. Each of the $CK_2$–$CK_5$ clock signals is a delayed version of the previous clock signal. The last clock signal, $CK_6$, is asserted by the rising edge of $CK_5$ and de-asserted by the falling edge of $CK_5$ and the rising edge of $CK_1$. The delays between the clock signal phases $d_{12}$, $d_{23}$, etc., are defined by the programmable delay elements 162–166.

In a further embodiment, a plurality of delay code register pairs Ld0 130 and Ld1 131 are used to provide for independent delay code control of one or more of the programmable delay elements. For example, each delay element can be coupled to a dedicated pair of delay code registers thereby allowing each programmable delay element to be independently controlled. Providing a higher ratio of delay code register pairs to programmable delay elements allows for greater flexibility in optimizing the circuit performance.

Figure 5:
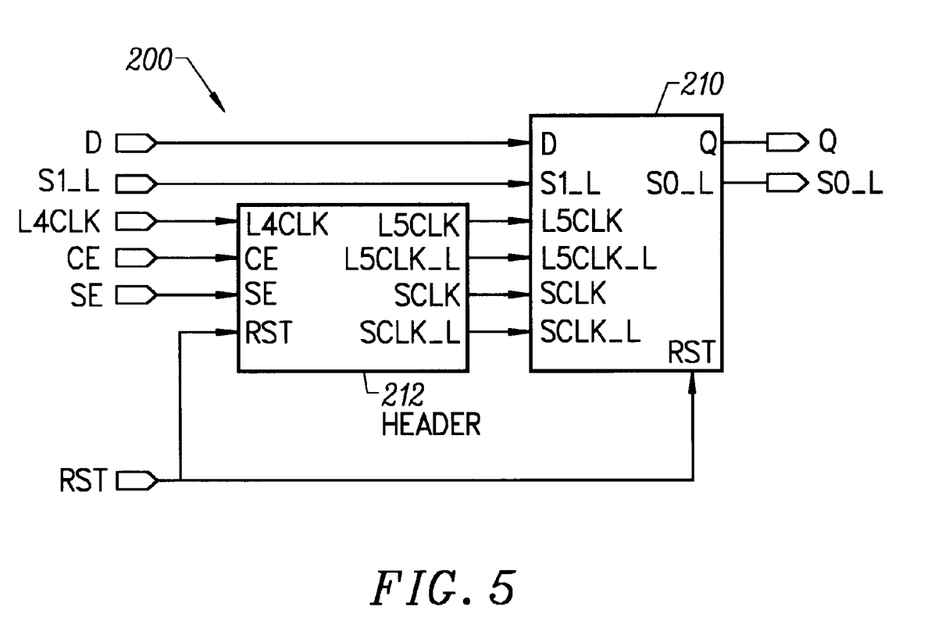
FIG. 5 illustrates a block diagram of a boundary-scan register according to an embodiment of the present invention.

FIG. 5 illustrates a block diagram of a boundary-scan register 200. The boundary-scan register 200 is a commonly used cell. Boundary-scan register 200 includes a flip-flop 210 and a clock header 212. Clock header 212 receives the L4CLK signal, which is the system clock, and in scan mode outputs the two scan clock signals, SCLK and SCLK_L. In scan mode, when SE is asserted to a logic high level, boundary-scan register 200 functions as a boundary-scan shift register to enable evaluation of the output data from the registers. In the normal operating mode, when SE is de-asserted to a logic low level, clock header 212 outputs the clock signal pair L5CLK and L5CLK_L.

Figure 6:
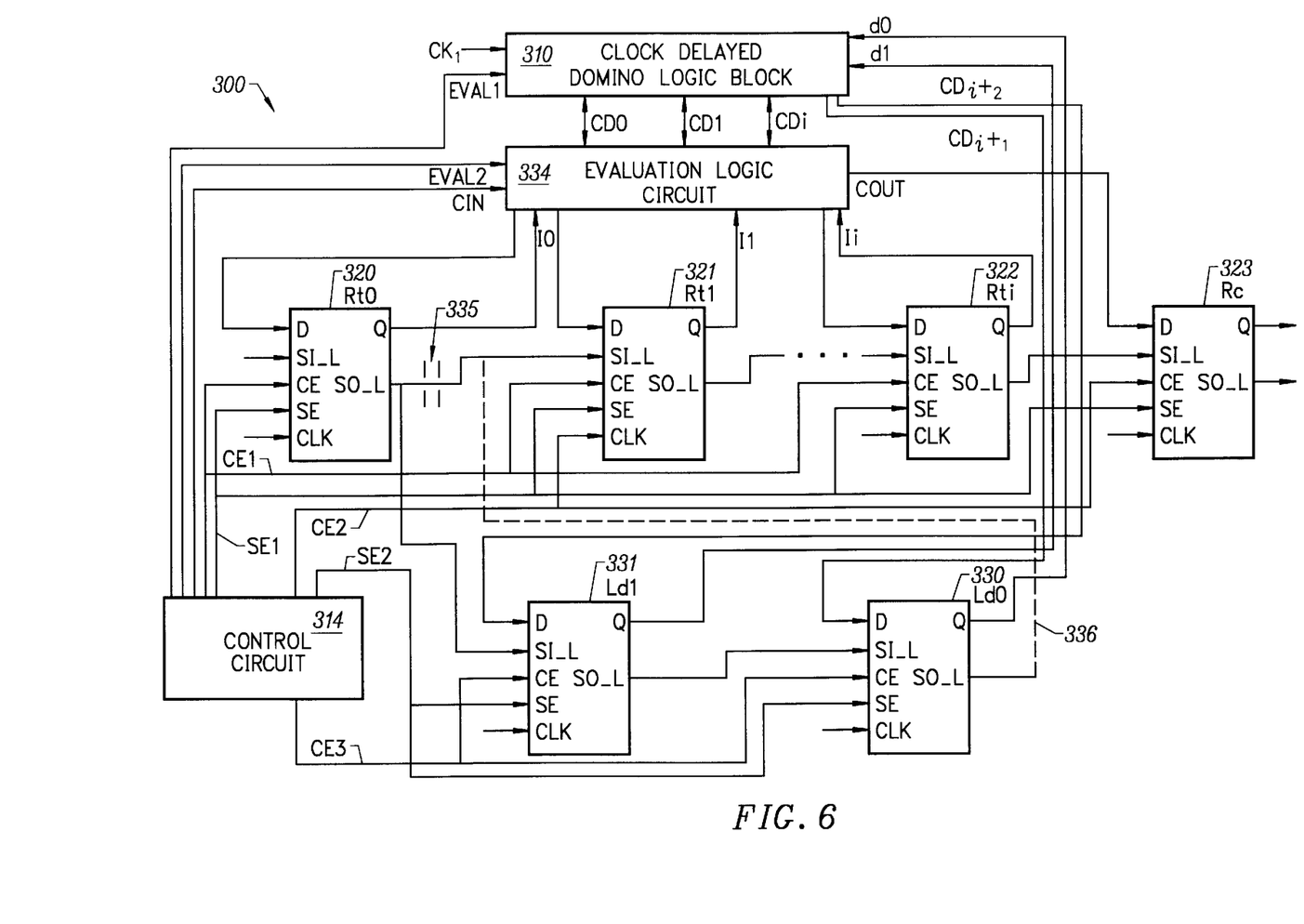
FIG. 6 illustrates a block diagram of a programmable delay CD domino logic system that includes evaluation logic according to an embodiment of the present invention.

FIG. 6 illustrates a block diagram of a programmable delay CD domino logic system 300 that includes evaluation logic. The programmable delay CD domino logic system 300 provides on-chip circuit performance evaluation using evaluation logic circuit 334. In one embodiment, evaluation logic circuit 334 comprises a group of comparators.

As described in regard to FIG. 2, initialization test data patterns can be loaded through the boundary-scan chain into CD domino logic block 310. The EVAL2 control signal is set to a logic low level, since the evaluation circuit 334 is bypassed, to load data from the boundary-scan chain registers Rt0 320–Rti 322 Q outputs through evaluation logic circuit 334 into CD domino logic block 310. The initialization test data pattern is coupled through data lines CD0–CDi to CD domino logic block 310.

With the FIG. 6 embodiment, in scan mode in addition to initialization test data patterns, data patterns of the expected output from CD domino logic block 310 can be loaded through the boundary-scan chain registers Rt0 320–Rti 322 into evaluation logic circuit 334. Reference data values for the comparators are loaded into evaluation logic circuit 334 through the boundary-scan register chain via inputs I0–Ii. Setting the EVAL2 control signal to a logic high level causes the reference data values received from the I0–Ii inputs to be stored in evaluation logic circuit 334 rather than coupled through to CD domino logic block 310.

After any required initialization data has been loaded in CD domino logic block 310, CD domino logic block 310 executes logic operations in the normal mode of operation. After completion of the logic operations, control circuit 314 asserts the EVAL1 signal to transfer the results of the logic operations from CD domino logic block 310 to evaluation logic circuit 334 over the CD0–CDi data lines. The CIN control signal is then asserted to compare each output value loaded from logic block 310 with the corresponding reference value. If all of the logic operation output signals match the reference values then the COUT signal is asserted to indicate the CD domino logic block 310 successfully performed the logic operations. The COUT signal value is stored by register Rc 323, and can ultimately be provided to an external test system. To minimize the overall size of the circuit, the comparators in evaluation logic circuit 334 may also be used for other purposes in the normal mode of operation.

The programmable delays can be used to optimize device performance as part of a characterization process. Initially, conservative values for the delays can be used to verify device functionality. The delays can then be incrementally reduced to increase the performance of the device until one or more errors are detected. When an error is detected the delay codes can be modified to restore full functionality. In this manner optimal delay values can be established to provide high performance and ensure reliability.

The programmable delays can also be used to avoid changing the hardware after modifications in the fabrication process used for a device. After a device design has been verified with prototypes, often the fabrication process is modified to reduce transistor sizes to further improve performance. These process modifications can affect circuit timing, and in conventional circuits these timing changes can require hardware modifications to restore valid timing relationships. By contrast, with the present invention delay values can be modified as necessary by simply changing the delay code values that are programmed through the boundary-scan chain thereby avoiding any hardware re-design.

FIG. 6 also illustrates an alternative delay code register configuration in which the D and Q terminals of the delay code registers Ld0 330 and Ld1 331 are not coupled together. In this case the clock enable, CE3, signal is generated by control circuit 314 rather than connected to a power supply as shown in FIG. 2. In this embodiment, after delay code values have been loaded into the delay code registers in program mode, the values are maintained in the delay code registers by the control circuit 314 driving the CE3 signal to a logic low level.

The D inputs of delay code registers Ld0 330 and Ld1 331 are coupled to the CDi+1 and CDi+2 outputs, respectively, of CD domino logic block 310. When the CE3 signal is asserted to a logic high level, data at the CD domino logic block 310 outputs CDi+1 and CDi+2 are loaded into delay code registers Ld0 330 and Ld1 331 make the data available for evaluation during the scan mode.

In a further embodiment, to provide enhanced circuit evaluation capabilities a software programmable logic array (PLA) can be used for logic circuit 334. Using a software programmable PLA provides the flexibility of being able to modify the evaluation process by re-programming the PLA. For example, different output signals can be selected to be evaluated, the desired output data pattern can be modified, and the number of output signals that are evaluated can be changed. In conjunction with the PLA a random access memory (RAM) block can be used to store the output data from CD domino logic block 310.

Figure 7:
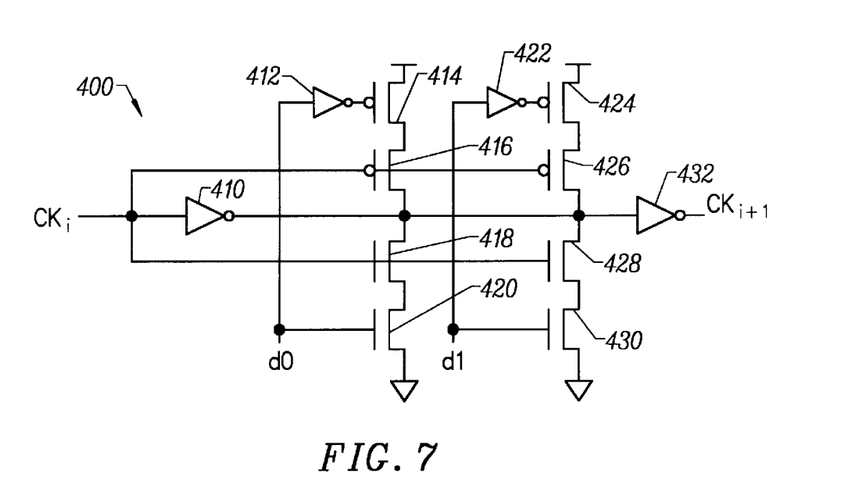
FIG. 7 illustrates a programmable delay element according to an embodiment of the present invention.

FIG. 7 illustrates a programmable delay element 400. Programmable delay element 400 generates a delayed clock signal $CK_{i+1}$ from an input clock signal $CK_i$. In a system with six clock signals, as shown in the FIG. 4 timing diagram, programmable delay element 400 can be used to generate clock signals $CK_2$–$CK_5$. The two bit delay code d0, d1 sets the delay to one of four values. The length of the delay is determined by the number of transistors loading the output of inverter 410 that are on. The more transistors that are on the stronger the driving power and the shorter the rising and falling transition times. The longest delay is the setting with d0 and d1 both low. With d0 and d1 low transistors 414, 420, 424 and 430 are all off. Table 1 illustrates an example of delays for one embodiment of programmable delay element 400.

TABLE 1

| | | Delay [ps] | |
|---|---|---|---|
| d1 | d0 | rise | fall |
| 0 | 0 | 350 | 275 |
| 0 | 1 | 250 | 225 |
| 1 | 0 | 200 | 200 |
| 1 | 1 | 175 | 175 |

Figure 8:
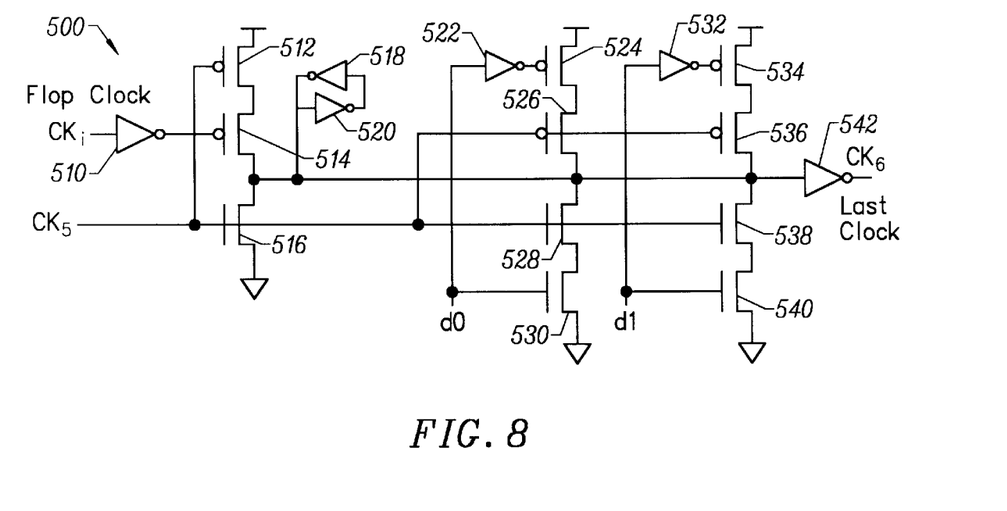
FIG. 8 illustrates a programmable delay element for the last clock phase in CD domino logic circuit according to an embodiment of the present invention.

FIG. 8 illustrates a programmable delay element for the last clock phase in CD domino logic circuit 110. As shown in FIG. 4, in contrast to the clock signals $CK_2$–$CK_5$ which are each generated by delaying an earlier clock signal, $CK_6$ is generated based upon the rising edge of CK1 and the falling edge of $CK_5$. When $CK_1$ transitions high inverter 510 outputs a low signal to turn on PMOS transistor 514. When $CK_5$ transitions low, the signal turns off NMOS transistor 516 and turns on PMOS transistor 512. Therefore with $CK_1$ high and $CK_5$ low, node 515 is driven high. The cross-coupled inverters 518 and 520 form a latch to maintain the state of node 515. Transitions at node 515 are then propagated through a pull-up and pull-down circuit, as in programmable delay element 400, and inverter 542 generates the output signal $CK_6$. The duration of the delay from the $CK_1$ and $CK_5$ clock transitions to the $CK_6$ transition is determined by the values of d0 and d1, as described above in regard to FIG. 7.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. For example, the present invention can be used to provide programmable delay elements in other types of dynamic logic devices, as well as static logic devices. More specifically, the present invention can be used to adjust the timing of any self-timed circuit in megacells, comparators, SRAMs, DRAMs, TLBs, PLAs, ROMs, I/O circuits, PLLs, etc. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of controlling delays in a logic circuit, said method comprising the steps of:

loading delay codes through a boundary-scan register chain into delay code memory elements; and executing logic operations in said logic circuit having delays controlled by said delay codes of said delay code memory elements.

2. The method of claim 1 wherein said logic circuit comprises a clock-delayed domino circuit.

3. The method of claim 2 further comprising the steps of:

evaluating results from said executing step to determine the adequacy of said delay codes; and re-loading selected delay codes in response to said evaluating step.

4. The method of claim 3 wherein said evaluating step further comprises the steps of:

driving logic operation results through said boundary-scan register chain; and comparing said logic operation results with predetermined data.

5. A programmable delay logic device, comprising:

a logic circuit;

a plurality of serially connected boundary-scan registers, coupled to said logic circuit, to receive delay codes;

a delay code memory element coupled to one of said boundary-scan registers to receive a selected delay code; and a programmable delay element coupled to said delay code memory element, said programmable delay element creating a predetermined delay in response to said selected delay code.

6. The programmable delay logic device of claim 5 wherein said logic circuit comprises a clock-delay domino circuit.

7. The programmable delay logic device of claim 6 further comprising an evaluation logic circuit to compare output data from said clock-delay domino circuit with a predetermined data pattern.

8. The programmable delay logic device of claim 7 wherein said evaluation logic circuit comprises a software programmable PLA.

9. The programmable delay logic device of claim 8 further comprising a memory element to store output data from said evaluation logic circuit.

* * * * *